United States Patent
Wang et al.

(10) Patent No.: US 12,315,795 B2
(45) Date of Patent: May 27, 2025

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Luguang Wang, Hefei (CN); Xiaoling Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 281 days.

(21) Appl. No.: 18/149,719

(22) Filed: Jan. 4, 2023

(65) Prior Publication Data
US 2024/0222266 A1 Jul. 4, 2024

Related U.S. Application Data

(63) Continuation of application No. PCT/CN2021/125491, filed on Oct. 22, 2021.

(30) Foreign Application Priority Data

Jul. 5, 2021 (CN) .......................... 202110758551.4

(51) Int. Cl.
*H01L 23/522* (2006.01)
*H01L 21/26* (2006.01)
(Continued)

(52) U.S. Cl.
CPC .......... *H01L 23/5226* (2013.01); *H01L 21/26* (2013.01); *H01L 21/324* (2013.01);
(Continued)

(58) Field of Classification Search
CPC ... H01L 23/5226; H01L 23/522; H01L 23/36; H01L 23/367; H01L 23/373; H01L 23/3736
See application file for complete search history.

(56) References Cited

U.S. PATENT DOCUMENTS 8,232,137 B2 7/2012 Gaul et al.
9,659,835 B1 5/2017 Gambino et al.
(Continued)

FOREIGN PATENT DOCUMENTS

CN 102097399 A 6/2011
CN 107403022 A 11/2017
(Continued)

OTHER PUBLICATIONS

International Search Report cited in PCT/CN2022/125491 mailed Mar. 14, 2022, 9 pages.

*Primary Examiner* — Thanhha S Pham
(74) *Attorney, Agent, or Firm* — Kilpatrick Townsend & Stockton LLP (57) ABSTRACT

The present application provides a semiconductor structure and a manufacturing method thereof. The method of manufacturing the semiconductor structure includes: providing a base, the base including a substrate and a first dielectric layer on the substrate; forming a through silicon via in the base, the through silicon via penetrating through the first dielectric layer, extending into the substrate, and having a depth less than a thickness of the base; forming an electrically conductive structure in the through silicon via; forming a filling hole in the first dielectric layer and the substrate, the filling hole surrounding the electrically conductive structure, exposing a sidewall of the electrically conductive structure and a part of the substrate, and having a stepwise sidewall; and forming a thermally conductive structure in the filling hole.

7 Claims, 5 Drawing Sheets

(51) Int. Cl.
  *H01L 21/324* (2006.01)
  *H01L 21/768* (2006.01)
  *H01L 23/367* (2006.01)
  *H01L 23/373* (2006.01)
  *H01L 23/528* (2006.01)
  *H01L 23/532* (2006.01)
(52) U.S. Cl.
  CPC .. *H01L 21/76814* (2013.01); *H01L 21/76843* (2013.01); *H01L 21/76883* (2013.01); *H01L 21/76886* (2013.01); *H01L 23/367* (2013.01); *H01L 23/3736* (2013.01); *H01L 23/528* (2013.01); *H01L 23/53209* (2013.01); *H01L 23/5329* (2013.01)

(56) References Cited

U.S. PATENT DOCUMENTS

| | | | |
|---|---|---|---|
| 2013/0270686 A1 | 10/2013 | Chen et al. | |
| 2014/0217603 A1* | 8/2014 | Moon | H01L 23/522 |
| | | | 257/774 |
| 2018/0190617 A1 | 7/2018 | Chew | |

FOREIGN PATENT DOCUMENTS

| | | |
|---|---|---|
| CN | 111769087 A | 10/2020 |
| CN | 112466846 A | 3/2021 |
| CN | 112736073 A | 4/2021 |

\* cited by examiner

SEMICONDUCTOR STRUCTURE AND MANUFACTURING METHOD THEREOF

CROSS-REFERENCE TO RELATED APPLICATIONS

This is a continuation of International Application No. PCT/CN2021/125491, filed on Oct. 22, 2021, which claims the priority to Chinese Patent Application 202110758551.4, titled "SEMICONDUCTOR STRUCTURE AND MANUFACTURING METHOD THEREOF" and filed with China National Intellectual Property Administration (CNIPA) on Jul. 5, 2021. The entire contents of International Application No. PCT/CN2021/125491 and Chinese Patent Application 202110758551.4 are incorporated herein by reference.

TECHNICAL FIELD

The present application relates, but is not limited, to a semiconductor structure and a manufacturing method thereof.

BACKGROUND

As a high-density packaging technique, the through silicon via (TSV) technique implements vertical electrical interconnection of a TSV by filling electrically conductive substances such as copper, tungsten and polycrystalline silicon.

Since multiple layers of dies are stacked together through the TSV, the power density is increased dramatically. Due to the large amount of heat and poor heat dissipation, the dies work at a high temperature, which seriously affects reliability and stability of the TSV. The high working temperature also results in metallic expansion in the TSV, such that a silicon base and a dielectric layer deform under stress, which further affects performance of components.

SUMMARY

An overview of the subject matter detailed in the present application is provided below. This overview is not intended to limit the protection scope of the claims.

The present application provides a semiconductor structure and a manufacturing method thereof.

A first aspect of the present application provides a method of manufacturing a semiconductor structure, including: providing a base, the base including a substrate and a first dielectric layer on the substrate; forming a TSV in the base, the TSV penetrating through the first dielectric layer, extending into the substrate, and having a depth less than a thickness of the base; forming an electrically conductive structure in the TSV; forming a filling hole in the first dielectric layer and the substrate, the filling hole surrounding the electrically conductive structure, exposing a sidewall of the electrically conductive structure and a part of the substrate, and having a stepwise sidewall; and forming a thermally conductive structure in the filling hole.

A second aspect of the present application provides a semiconductor structure including: a base including a substrate and a first dielectric layer on an upper surface of the substrate; an electrically conductive structure penetrating through the first dielectric layer, extending into the substrate, and having a depth less than a thickness of the base; and a thermally conductive structure located in the base, surrounding the electrically conductive structure, and having a stepwise sidewall.

Other aspects of the present application are understandable upon reading and understanding of the accompanying drawings and detailed description.

BRIEF DESCRIPTION OF THE DRAWINGS

The drawings incorporated into the specification and constituting a part of the specification illustrate the embodiments of the present application, and are used together with the descriptions to explain the principles of the embodiments of the present application. In these accompanying drawings, similar reference numerals represent similar elements. The drawings in the following description are some rather than all of the embodiments of the present application. Those skilled in the art may obtain other accompanying drawings based on these accompanying drawings without creative efforts.

DETAILED DESCRIPTION

The technical solutions in embodiments of the present application are described below clearly and completely with reference to the drawings in the embodiments of the present application. Apparently, the described embodiments are merely part rather than all of the embodiments of the present application. All other embodiments obtained by a person skilled in the art based on the embodiments of the present application without creative efforts should fall within the protection scope of the present application. It should be noted that the embodiments in the present application and features in the embodiments may be arbitrarily combined with each other in a non-conflicting situation.

Figure 1:
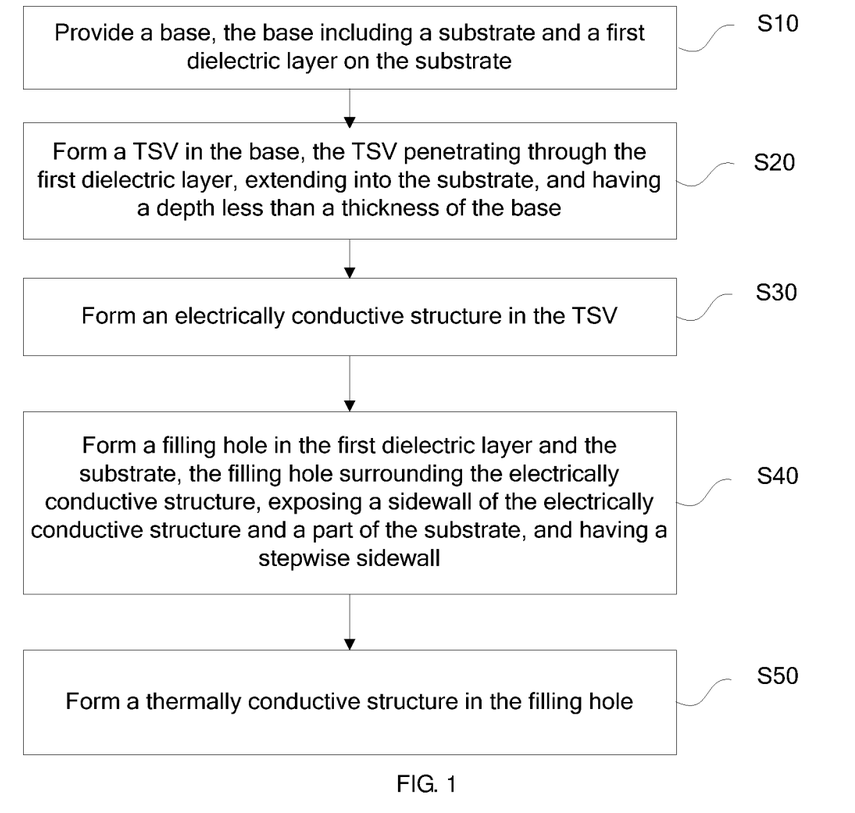
FIG. 1 is a flowchart of a method of manufacturing a semiconductor structure according to an embodiment of the present application.

An embodiment of the present application provides a method of manufacturing a semiconductor structure. As shown in FIG. 1, the method includes:

Step S10: Provide a base, the base including a substrate and a first dielectric layer on the substrate.

Step S20: Form a TSV in the base, the TSV penetrating through the first dielectric layer, extending into the substrate, and having a depth less than a thickness of the base.

Step S30: Form an electrically conductive structure in the TSV.

Step S40: Form a filling hole in the first dielectric layer and the substrate, the filling hole surrounding the electrically conductive structure, exposing a sidewall of the electrically conductive structure and a part of the substrate, and having a stepwise sidewall.

Step S50: Form a thermally conductive structure in the filling hole.

According to the method of manufacturing a semiconductor structure, with the stepwise sidewall of the filling hole, the stepwise thermally conductive structure is also formed in the filling hole, which facilitates upward heat dissipation of the electrically conductive structure, thereby preventing heat from being accumulated to cause an overhigh temperature of the device and to affect components in an active region of the semiconductor structure. The TSV structure can be more reliable and stable by improving its heat dissipation capability.

In Step S10, the substrate may be made of silicon, silicon carbide, silicon nitride, silicon on insulator (SOI), stacked silicon on insulator (SSOI), stacked silicon-germanium on insulator (S-SiGeOI), silicon-germanium on insulator (SiGeOI), and germanium on insulator (GeOI). The first dielectric layer may be made of at least one selected from the group consisting of silicon dioxide, silicon oxynitride, silicon nitride and a low-dielectric-constant (low-k) dielectric. The low-k dielectric material may be hydrosilicate or porous silicate. In the embodiment of the present application, the first dielectric layer may be a silicon dioxide layer. A shallow trench isolation (STI) structure and an active region may be provided on an upper surface of the substrate.

Figure 2:
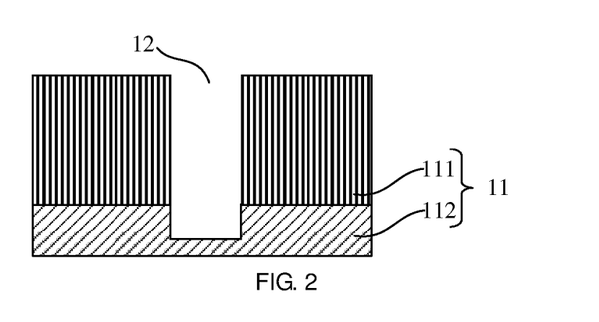
FIG. 2 is a schematic view showing a cross-sectional structure of a semiconductor structure obtained after a TSV is formed in a base according to an embodiment of the present application.

In Step S20, referring to FIG. 2 which shows a cross-sectional view of a semiconductor structure obtained after a TSV 12 is formed in the base 11. The TSV 12 penetrates through the first dielectric layer 111 and partially extends into the substrate 112. Since the TSV 12 does not penetrate through the substrate 112, a depth of the TSV 12 is smaller than a thickness of the base 11.

Figure 3:
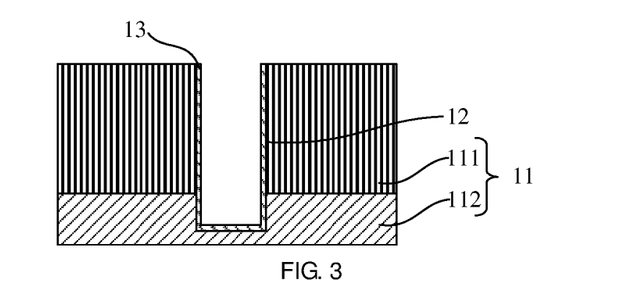
FIG. 3 is a schematic view showing a cross-sectional structure of a semiconductor structure obtained after a second dielectric layer is formed in a TSV according to an embodiment of the present application.
Figure 4:
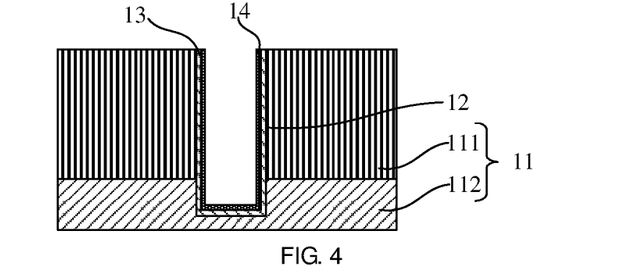
FIG. 4 is a schematic view showing a cross-sectional structure of a semiconductor structure obtained after a first metal layer is formed on a surface of a second dielectric layer according to an embodiment of the present application.
Figure 5:
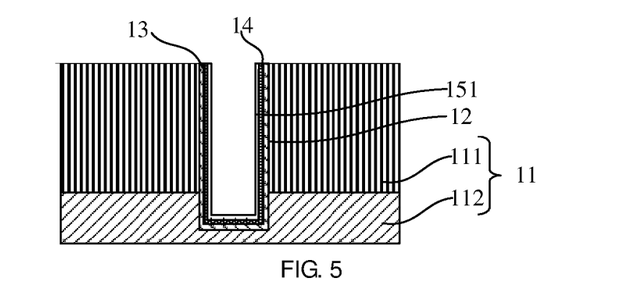
FIG. 5 is a schematic view showing a cross-sectional structure of a semiconductor structure obtained after a metal barrier layer is formed on a surface of a first metal layer according to an embodiment of the present application.

In an exemplary implementation, referring to FIG. 3 to FIG. 5, after the TSV 12 is formed in the base 11, a second dielectric layer 13 and a first metal layer 14 may be formed in the TSV 12 first and then an electrically conductive structure 15 is formed in the TSV 12.

As shown in FIG. 3, the second dielectric layer 13 is formed on a sidewall and a bottom of the TSV 12. The second dielectric layer 13 may be made of at least one selected from the group consisting of silicon dioxide, silicon oxynitride, silicon nitride and a low-k dielectric. The low-k dielectric material may be hydrosilicate or porous silicate. In an exemplary implementation, a silicon oxide layer may be formed on the sidewall and the bottom of the TSV 12 by chemical vapor deposition (CVD) or atomic layer deposition (ALD) to serve as the second dielectric layer 13. FIG. 4 is a schematic view showing a cross-sectional structure of a semiconductor structure obtained after the first metal layer 14 is formed on a surface of the second dielectric layer 13. The first metal layer 14 may be a cobalt layer, an aluminum layer, a titanium nitride layer or a ruthenium layer.

Figure 6:
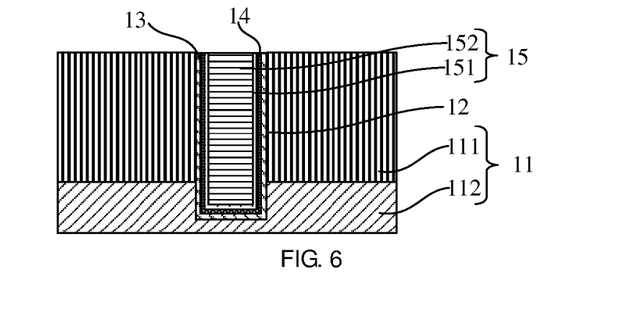
FIG. 6 is a schematic view showing a cross-sectional structure of a semiconductor structure obtained after an electrically conductive layer is formed according to an embodiment of the present application.

In Step S30, referring to FIG. 6, the electrically conductive structure 15 is formed in the TSV 12. The electrically conductive structure 15 includes a metal barrier layer 151 and an electrically conductive layer 152, as shown in FIG. 5. For example, the metal barrier layer 151 may be deposited on a surface of the first metal layer 14 first. The metal barrier layer 151 may be a tantalum layer or a tantalum nitride layer. On the basis of the structure shown in FIG. 5, the electrically conductive layer 152 is formed in the TSV 12. For example, a copper seed layer may be deposited on a surface of the metal barrier layer 151. Then, copper is deposited in the TSV 12 by electroplating to fully fill the TSV 12, and a copper layer is flush with an upper surface of the first dielectric layer 111. FIG. 6 is a schematic view showing a cross-sectional structure of a semiconductor structure obtained after the electrically conductive structure 15 is formed in the TSV 12.

Figure 14:
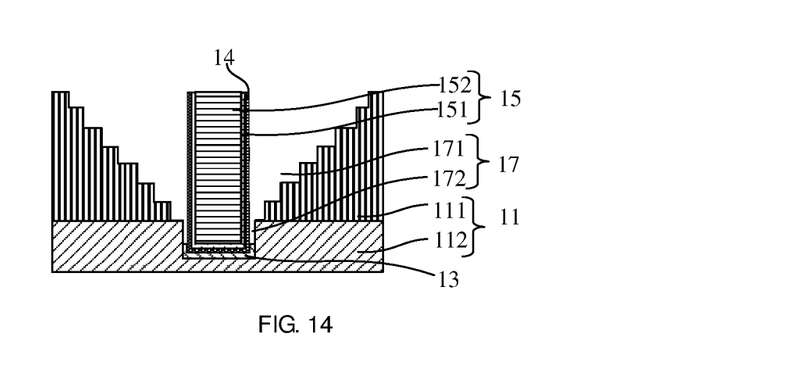
FIG. 14 is a schematic view showing a cross-sectional structure of a semiconductor structure obtained after a filling gap is formed in a substrate according to an embodiment of the present application.

In Step S40, referring to FIG. 14, a filling hole 17 is formed in the first dielectric layer 111 and the substrate 112. The filling hole 17 surrounds the electrically conductive structure 15, exposes a sidewall of the conductive structure 15 and a part of the substrate 112, and has a stepwise sidewall.

In an exemplary implementation, referring to FIG. 14, the step of forming a filling hole 17 in the first dielectric layer 111 and the substrate 112 includes:

Step S41: Etch the first dielectric layer 111 to form a filling through via 171 in the first dielectric layer 111.

Step S42: Remove a part of the second dielectric layer 13, such that an upper surface of the remaining second dielectric layer 13 is lower than an upper surface of the substrate 112, and a filling gap 172 is formed in the substrate 112, the filling gap 172 and the filling through via 171 jointly forming the filling hole 17.

Figure 7:
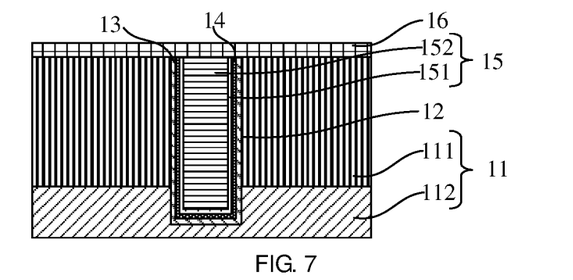
FIGS. 7-13 each are a schematic view showing a cross-sectional structure in a step of forming a filling through via in a first dielectric layer according to an embodiment of the present application.
Figure 8:
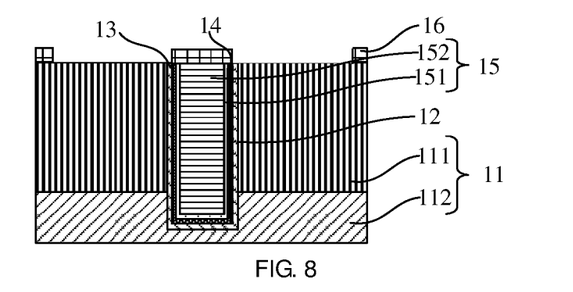
Figure 9:
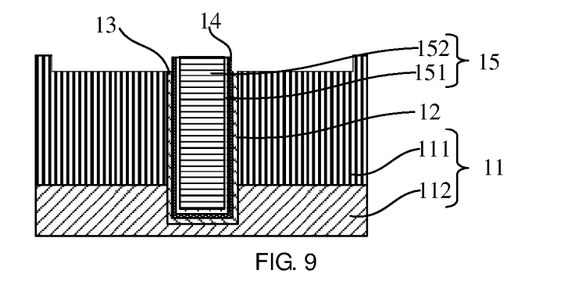
Figure 10:
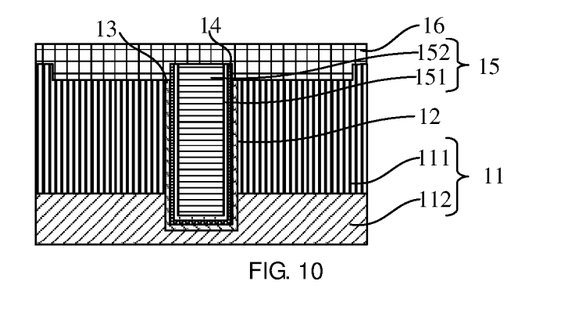
Figure 11:
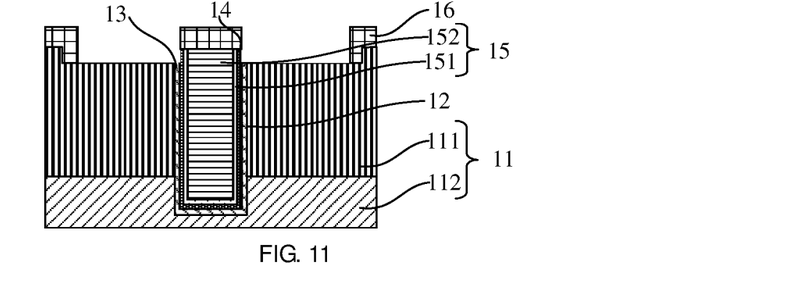
Figure 12:
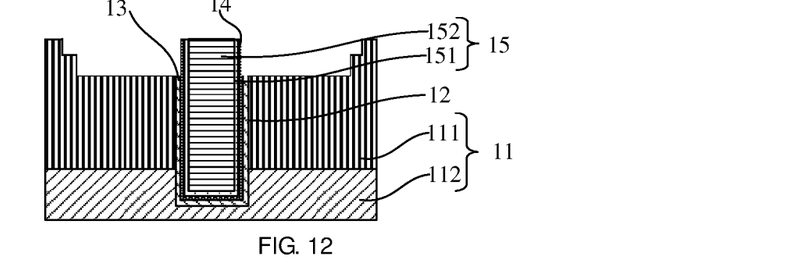
Figure 13:
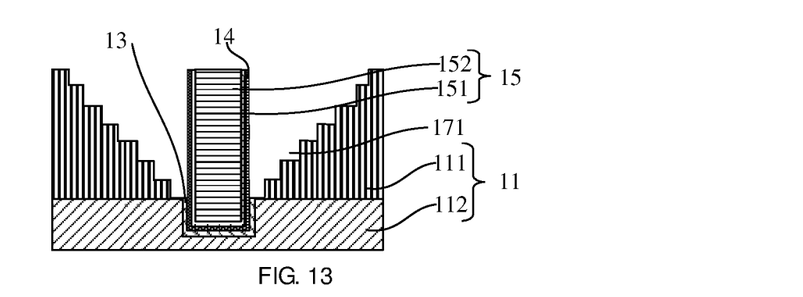

In an exemplary implementation, Step S41 of forming a filling through via 171 may refer to FIG. 7 to FIG. 13. The first dielectric layer 111 is photoetched repeatedly to gradually form the filling through via 171 shown in FIG. 13. For example, a photoresist layer 16 is formed on an upper surface of the semiconductor structure shown in FIG. 6, as shown in FIG. 7. A part of the upper surface of the first dielectric layer 111, namely the part to be etched, is subjected to exposure and development, as shown in FIG. 8. A part of the first dielectric layer 111 is removed by etching, and the photoresist is cleaned to obtain the semiconductor structure shown in FIG. 9. The part of the first dielectric layer 111 may be removed by dry etching, and the etching gas may include a fluorine-based gas such as sulfur hexafluoride and carbon tetrafluoride. As shown in FIG. 10 to FIG. 12, in order to form the complete stepwise filling through via 171, processes such as photoresist coating, exposure, development, etching and cleaning may be repeated on the semiconductor structure shown in FIG. 9 to obtain the semiconductor structure shown in FIG. 12. Processes in FIG. 10 to FIG. 12 are repeated to form the stepwise filling through via 171 in the first dielectric layer 111, as shown in FIG. 13.

In order to further improve the heat dissipation capability of the TSV 12 structure, on the basis of the semiconductor structure shown in FIG. 13, a part of the second dielectric layer 13 may be removed, such that the upper surface of the second dielectric layer 13 is lower than the upper surface of the substrate 112, and the filling gap 172 is formed in the substrate 112, as shown in FIG. 14. The filling through via 171 and the filling gap 172 jointly form the filling hole 17. A diameter of the filling hole 17 is increased stepwise from bottom to top.

Figure 15:
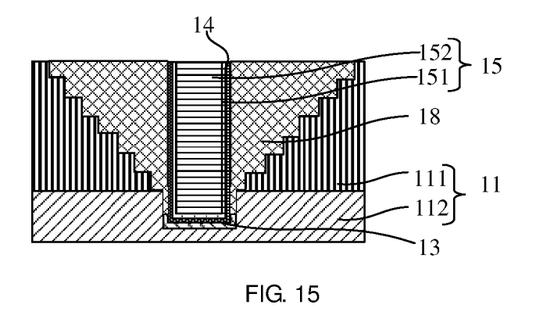
FIG. 15 is a schematic view showing a cross-sectional structure of a semiconductor structure obtained after a thermally conductive structure is formed according to an embodiment of the present application.

In Step S50, referring to FIG. 14 to FIG. 15, a thermally conductive structure 18 is formed in the filling hole 17. In an exemplary implementation, a thermally conductive metal may be filled in the filling hole 17 to serve as the thermally conductive structure 18. The thermally conductive structure 18 is fully filled in the filling hole 17, as shown in FIG. 15. The thermally conductive metal may be tungsten, silver, platinum, aluminum, nickel, ruthenium or cobalt. For example, the thermally conductive metal may be in a granular form to facilitate heat dissipation. The stepwise thermally conductive structure 18 is formed around the TSV 12 (referring to FIG. 2) structure and the thermally conductive structure 18 is tapering-off-shaped, which facilitates upward heat dissipation, thereby preventing a phenomenon that heat cannot be dissipated timely to affect components around the bottom of the TSV 12. Meanwhile, since the thermally conductive structure 18 is narrow at the bottom and wide at the top, the thermally conductive structure has a less occupied area in the active region, and the degree of crowdedness for devices in the active region is alleviated, thereby improving the heat dissipation efficiency In an exemplary implementation, referring to FIG. 14 to FIG. 15, the substrate 112 may be a silicon substrate. After the thermally conductive structure 18 is formed in the filling hole 17, the thermally conductive structure 18 is annealed. The thermally conductive structure 18 reacts with the substrate 112 to form a metal silicide layer. The metal silicide can effectively solve the tricky heat dissipation of the TSV structure, with a desirable thermal conductivity. When heat on the electrically conductive structure 15 is conducted by the thermally conductive metal to the substrate 112, the metal silicide does not obstruct the heat, but can quickly conduct the heat, which prevents the heat from being accumulated to the substrate 112 to cause a temperature rise of the base and to affect the working performance of the device in the active region.

Figure 16:
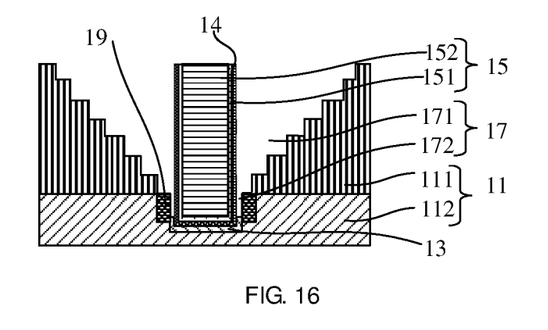
FIG. 16 is a schematic view showing a cross-sectional structure of a semiconductor structure obtained after a loose region is formed in a substrate according to an embodiment of the present application.
Figure 17:
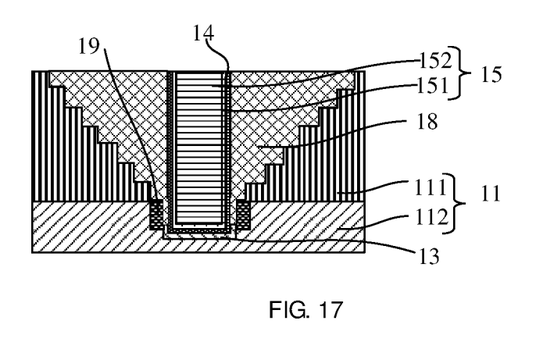
FIG. 17 is a schematic view showing a cross-sectional structure of a semiconductor structure obtained after a thermally conductive structure is formed according to another embodiment of the present application.

In an exemplary implementation, referring to FIG. 16 to FIG. 17, before the thermally conductive structure 18 is formed in the filling hole 17, the method of manufacturing a semiconductor structure further includes: Ion bombardment is performed on the exposed substrate 112 to form a loose region 19 in the substrate 112. The loose region 19 surrounds the electrically conductive structure 15. As an example, Ar ion bombardment may be performed on the substrate 112 exposed by the filling hole 17 to form the loose region 19. For example, the radio frequency (RF) power may be controlled in a range between 30 W and 100 W, and may be 40 W, 50 W, 60 W, 70 W, 80 W and 90 W for example. The flow rate of the charged Ar gas falls into a range between 10 sccm and 150 sccm, and may be 30 sccm, 50 sccm, 80 sccm, 100 sccm and 120 sccm for example. The ion bombardment time may fall into a range between 10 s and 200 s, and may be 30 s, 50 s, 80 s, 100 s, 150 s and 180 s for example. In an exemplary implementation, after the filling hole 17 is formed, the ion bombardment may be performed on the substrate 112 after the remaining photoresist is removed, and the ion bombardment may also be performed on the substrate 112 before the remaining photoresist is removed. FIG. 16 is a schematic view showing a cross-sectional structure of a semiconductor structure obtained after the ion bombardment. After the loose region 19 is formed, the thermally conductive metal is filled in the filling hole 17 to form the thermally conductive structure 18, thereby obtaining the semiconductor structure shown in FIG. 17.

With the ion bombardment on the substrate 112 to form the loose region 19, the heat dissipation capability of the semiconductor structure can further be improved. When the thermally conductive structure 18 conducts the heat to the substrate 112, the loose region 19 in the substrate 112 can accelerate the heat dissipation and prevent the heat accumulation.

An embodiment of the present application further provides a semiconductor structure. As shown in FIG. 15, the semiconductor structure includes: a base 11 including a substrate 112 and a first dielectric layer 111 on an upper surface of the substrate 112; an electrically conductive structure 15 penetrating through the first dielectric layer 111, extending into the substrate 112, and having a depth less than a thickness of the base 11; and a thermally conductive structure 18 located in the base 11, surrounding the electrically conductive structure 15, and having a stepwise sidewall.

The base 11 may be a silicon base 11. The first dielectric layer 111 may be a silicon dioxide layer. The electrically conductive structure 15 may be located in a TSV 12 (referring to FIG. 2) to implement vertical electrical interconnection for multiple layers of dies. Since the multiple layers of dies are stacked, the power density is increased dramatically, and the temperature of the electrically conductive structure 15 is risen rapidly, which affects the reliability and stability of the electrically conductive structure 15 and the electronic device. The thermally conductive structure 18 having the stepwise sidewall is provided around the electrically conductive structure 15, such that the heat can be dissipated upward more rapidly, and the heat dissipation efficiency is improved.

In an exemplary implementation, referring to FIG. 13, the semiconductor structure further includes a first metal layer 14 and a second dielectric layer 13. Referring also to FIG. 15, the first metal layer 14 is located on a sidewall and a bottom of the electrically conductive structure 15. The first metal layer 14 is attached to the sidewall and the bottom of the electrically conductive structure 15. Referring also to FIG. 13, the second dielectric layer 13 is located in the substrate 112 and covers a bottom and a part of a sidewall of the first metal layer 14.

In an exemplary implementation, referring to FIG. 14, the electrically conductive structure 15 includes a metal barrier layer 151 and an electrically conductive layer 152. The metal barrier layer 151 is located between the electrically conductive layer 152 and the first metal layer 14. The metal barrier layer 151 may be a tantalum layer or a tantalum nitride layer. The electrically conductive layer 152 may be a copper layer.

In an exemplary implementation, as shown in FIG. 15, a diameter of the thermally conductive structure 18 is increased stepwise from bottom to top. Since the diameter of the thermally conductive structure 18 is increased stepwise from bottom to top, the heat dissipation structure has a less occupied area in the active region of the substrate 112, and the degree of crowdedness for devices in the active device is alleviated. The heat is generally dissipated upward, and the tapering-off-shaped heat dissipation structure facilitates upward heat dissipation, thereby preventing the heat from being accumulated around the bottom of the electrically conductive structure 15 to cause a temperature rise of the substrate 112 and to affect the performance of the electronic device in the active region.

In an exemplary implementation, referring to FIG. 14 to FIG. 15, the thermally conductive structure 18 includes a thermally conductive metal. The thermally conductive metal may be, for example, tungsten, silver, platinum, aluminum, nickel, ruthenium or cobalt. As an example, the thermally conductive metal may be filled in the filling hole 17 in a granular form. With the granular thermally conductive structure 18, not only can the heat be conducted timely with an excellent thermal conductivity of the thermally conductive metal, but the heat can also be dissipated conveniently with gaps between granules.

In an exemplary implementation, referring to FIG. 16 to FIG. 17, the substrate 112 includes a loose region 19. As shown in FIG. 17, the loose region 19 is located in the substrate 112, and surrounds the electrically conductive structure 15. With the loose region 19 in the substrate 112, the heat from the thermally conductive structure 18 can further be dissipated, thereby preventing the heat from being accumulated to the substrate 112 to cause a temperature rise of the substrate 112 and to affect the working performance of the devices in the active region.

In an exemplary implementation, referring to FIG. 17, a material of the substrate 112 includes silicon. The semiconductor structure further includes a metal silicide layer (not shown in the figure). The metal silicide layer is located between the thermally conductive structure 18 and the loose region 19. Similar to the thermally conductive metal, the metal silicide also has an excellent thermal conductivity, and can accelerate conduction and dissipation of the heat from the electrically conductive structure 15 with the thermally conductive structure 18, thereby reducing the heat accumulation.

The embodiments or implementations of this specification are described in a progressive manner, and each embodiment focuses on differences from other embodiments. The same or similar parts between the embodiments may refer to each other.

In the description of the specification, the description with reference to terms such as "an embodiment", "an illustrative embodiment", "some implementations", "an illustrative implementation" and "an example" means that the specific feature, structure, material or feature described in combination with the implementation(s) or example(s) is included in at least one implementation or example of the present application.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present application, the terms such as "center", "top", "bottom", "left", "right", "vertical", "horizontal", "inner" and "outer" indicate the orientation or position relationships based on the drawings. These terms are merely intended to facilitate description of the present application and simplify the description, rather than to indicate or imply that the mentioned device or element must have a specific orientation and must be constructed and operated in a specific orientation. Therefore, these terms should not be construed as a limitation to the present application.

It can be understood that the terms such as "first" and "second" used in the present application can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to make the understanding of the present application more clearly, many specific details of the present application, such as the structure, material, size, processing process and technology of the device, are described below. However, as those skilled in the art can understand, the present application may not be implemented according to these specific details.

Finally, it should be noted that the above embodiments are merely used to explain the technical solutions of the present application, but are not intended to limit the present application. Although the present application is described in detail with reference to the foregoing embodiments, those of ordinary skill in the art should understand that they can still modify the technical solutions described in the foregoing embodiments, or make equivalent substitutions on some or all technical features therein. These modifications or substitutions do not make the essence of the corresponding technical solutions deviate from the spirit and scope of the technical solutions of the embodiments of the present application.

INDUSTRIAL APPLICABILITY

According to the semiconductor structure and the manufacturing method thereof provided by the embodiments of the present application, with the stepwise sidewall of the filling hole, the stepwise thermally conductive structure is also formed in the filling hole, which facilitates upward heat dissipation of the electrically conductive structure, thereby preventing heat from being accumulated to cause an over-high temperature of the device and to affect components in an active region of the semiconductor structure. The TSV structure can be more reliable and stable by improving its heat dissipation capability.

The invention claimed is:

1. A semiconductor structure, comprising:
   a base, comprising a substrate and a first dielectric layer on an upper surface of the substrate;
   an electrically conductive structure, penetrating through the first dielectric layer, extending into the substrate, and having a depth less than a thickness of the base; and
   a thermally conductive structure, located in the base, surrounding the electrically conductive structure, and having a stepwise sidewall.

2. The semiconductor structure according to claim 1, further comprising:
   a first metal layer, located on a sidewall and a bottom of the electrically conductive structure; and
   a second dielectric layer, located in the substrate, and covering a bottom and a part of a sidewall of the first metal layer.

3. The semiconductor structure according to claim 2, wherein the electrically conductive structure comprises a metal barrier layer and an electrically conductive layer; and the metal barrier layer is located between the electrically conductive layer and the first metal layer.

4. The semiconductor structure according to claim 1, wherein a diameter of the thermally conductive structure is increased stepwise from bottom to top.

5. The semiconductor structure according to claim 1, wherein the thermally conductive structure comprises a thermally conductive metal.

6. The semiconductor structure according to claim 1, wherein the substrate comprises a loose region located in the substrate, and surrounding the electrically conductive structure.

7. The semiconductor structure according to claim 6, wherein a material of the substrate comprises silicon, the semiconductor structure further comprises a metal silicide layer, and the metal silicide layer is located between the thermally conductive structure and the loose region.

* * * * *